United States Patent [19]

Mathuda et al.

[11] Patent Number: 5,177,377
[45] Date of Patent: Jan. 5, 1993

[54] BI-CMOS CIRCUIT

[75] Inventors: Hiroyuki Mathuda; Shinzou Satou, both of Kawasaki, Japan

[73] Assignee: Fujitsu Limited, Kawasaki, Japan

[21] Appl. No.: 700,426

[22] Filed: May 15, 1991

[30] Foreign Application Priority Data

May 15, 1990 [JP] Japan ................. 2-124354

[51] Int. Cl.[5] ........................................... H03K 19/01
[52] U.S. Cl. .................................. 307/446; 307/443; 307/570
[58] Field of Search ............ 307/443, 446, 570, 265, 307/594

[56] References Cited

U.S. PATENT DOCUMENTS

| 4,301,383 | 11/1981 | Taylor | 307/570 |
|---|---|---|---|
| 4,883,979 | 11/1989 | Tran | 307/446 |
| 4,902,914 | 2/1990 | Masuoka | 307/446 |
| 4,970,414 | 11/1990 | Ruth. Jr. | 307/446 |
| 4,985,645 | 1/1991 | Tsutsui | 307/446 |
| 5,013,936 | 5/1991 | Shiomi et al. | 307/446 |

Primary Examiner—David Hudspeth
Attorney, Agent, or Firm—Staas & Halsey

[57] ABSTRACT

A Bi-CMOS circuit includes a bipolar output stage and a CMOS circuit. The bipolar output stage includes pull-up and pull-down transistors which form an output end. The CMOS circuit receives an input signal and generates a signal for driving the output stage. The CMOS circuit comprises a CMOS inverter for receiving the input signal, a p-channel MOS transistor for driving the pull-up transistor of the bipolar output stage based on the input signal, an n-channel MOS transistor for driving the pull-down transistors of the bipolar output stage based on the input signal, a p-channel MOS transistor for discharging a base of the pull-up transistor based on an output of the CMOS inverter, and an n-channel MOS transistor for discharging a base of the pull-down transistor based on an output of the CMOS inverter.

11 Claims, 3 Drawing Sheets

BI-CMOS CIRCUIT

BACKGROUND OF THE INVENTION

1. Field of the Invention

The present invention relates to a Bi-CMOS circuit, and particularly, to a CMOS-TTL high-speed conversion output buffer.

2. Description of the Related Art

As the demand for an improved operation speed and a lowering of the power consumption of computer systems increases, greater integration, speed, and lower power consumption are required from LSIs. In an effort to meet these requirements, Bi-CMOS LSIs are now under development.

FIG. 3 shows an output buffer of a conventional Bi-CMOS LSI, the output of which is realized with TTL circuitry. In the figure, numerals 10 and 20 denote first and second CMOS inverters, 30 denotes a totempole type bipolar output stage, MP represents a p-channel MOS transistor, MN represents an n-channel MOS transistor, Q1, Q2 and Q3 denote bipolar transistors, $SD_1$ and $SD_2$ denotes Schottky barrier diodes (SBDs), and $R_1$ and $R_2$ denote resistors.

When an input IN of this circuit is high (H), MN1 turns and the MP1 turns OFF to thus make an output node "a" low (L). This turns the MP2 ON and the MN2 OFF, to thereby make an output node "b" H, which turns ON Q3, turns OFF Q1 and Q2, and turns ON MP3, to thereby make an output OUT L.

When the input IN is L, the MP1 is turned ON and the MN1 is turned OFF, to make the node "a" H. This turns the MP2 OFF and turns the MN2 ON, thereby setting the node "b" L, whereby Q3 is turned OFF, Q1 and Q2 are turned ON, and the MP3 is turned OFF, thereby making the output OUT H. The transistor MP3 is used to discharge a base of the transistor Q2.

As shown in the figure, the conventional Bi-CMOS TTL-type output buffer comprises two CMOS inverter stages and a bipolar output stage; the CMOS inverter stages are arranged in series, to generate signals for driving transistors of the bipolar output stage.

Namely, the output stage 30 comprises the npn transistors Q1 and Q2 having a Darlington connection for pulling up the output end OUT, and the npn transistor Q3 for pulling down the output end OUT. The transistor Q1 on the pull-up side is driven by an output of the node "a", i.e., an output of the first CMOS inverter stage, and the transistor Q3 on the pull-down side is driven by an output of the node "b", i.e., an output of the second CMOS inverter stage.

In this arrangement, a change from L to H (pulling up) at the output OUT is slightly delayed with respect to the input IN, and a change from H to L (pulling down) at the output OUT is significantly delayed with respect to the input IN. This unbalanced state of a quick rise and slow fall may cause a fluctuation of a duty ratio of an output waveform, and thus this problem an unbalanced state must be taken into account when designing the circuit, and gates added for adjusting the duty ratio.

SUMMARY OF THE INVENTION

An object of the invention is to solve the above problems by ensuring an equal delay of a rise and a fall in an output waveform, to thus ensure that no change occurs in a duty ratio of an output waveform.

To accomplish the object, the present invention provides a Bi-CMOS circuit having an output stage and a CMOS circuit. The output stage includes a pull-up transistor and a pull-down transistor connected in series between a high-potential power source and a low-potential power source, wherein a node of the transistors forms an output end and the transistors receive drive signals, respectively. The CMOS circuit receives an input signal and generates the drive signals for driving the output stage, and comprises a CMOS inverter 10 for receiving an input signal IN, and a CMOS circuit 40. The CMOS circuit 40 includes a p-channel MOS transistor TR5 for driving the pull-up transistor of the output stage according to the input signal IN, a MOS transistor TR3 for driving the pull-down transistor of the output stage according to the input signal IN, a MOS transistor TR6 for discharging the pull-up transistor according to an output of the CMOS inverter, and a MOS transistor TR4 for discharging the pull-down transistor according to an output of the CMOS inverter.

The bipolar output stage may have two pull-up transistors Q1 and Q2 driven (turned ON) by, for example, the p-channel MOS transistor TR5, and a pull-down transistor Q3 driven by the MOS transistor TR3. The transistors TR5 and TR3 are driven by the input signal IN. Namely, only one MOS transistor is arranged between the input signal and the pull-up transistors, and between the input signal and the pull-down transistor, and thus the same delay occurs at the pull-up side and at tee pull-down side. Unlike the conventional circuit of FIG. 3, therefore, the invention ensure that no change in a duty ratio of an output signal occurs. Further, the delay occuring in the circuit of the invention is shortened because only one MOS transistor effects such a delay.

An output of the CMOS inverter 10 turns the MOS transistors TR6 and TR4 ON or OFF. The transistor TR6 discharges a base of the transistor Q1 when the transistor Q1 is turned OFF, and the transistor TR4 discharges a base of the transistor Q3 when the transistor Q3 is turned OFF.

DESCRIPTION OF THE PREFERRED EMBODIMENTS

As explained above, the Bi-CMOS circuit of the invention basically comprises an output stage and a CMOS circuit. The output stage includes pull-up and pull-down transistors connected in series between high- and low-potential power sources wherein a node of the transistors forms an output end, and the transistors receive drive signals, respectively. The CMOS circuit receives an input signal and generates the driving signals for driving the output stage, and comprises a CMOS inverter 10 for receiving an input signal IN, and a CMOS circuit 40. The CMOS circuit 40 includes a p-channel MOS transistor TR5 for driving the pull-up transistor of the output stage by the input signal IN, a MOS transistor TR3 for driving the pull-down transistor of the output stage by the input signal IN, a MOS transistor TR6 for discharging the pull-up transistor by an output of the CMOS inverter, and a MOS transistor TR4 for discharging the pull-down transistor by an output of the CMOS inverter.

The arrangement of this Bi-CMOS circuit will be explained in detail with reference to FIG. 1.

The MOS transistors TR5, TR6, and TR4 are connected in series between the high-potential power source and the low-potential power source. A gate of the MOS transistor TR5 is directly connected to an input end of the CMOS inverter; gates of the MOS transistors TR6 and TR4 are connected to an output end of the CMOS inverter; the MOS transistor TR3 is connected in parallel with the MOS transistors TR5 and TR6; a gate of the MOS transistor TR3 is connected to the input end of the CMOS inverter; a node of the MOS transistors TR5 and TR6 is connected to a driving end of the pull-up transistor of the output stage; and a node of the MOS transistors TR6 and TR4 is connected to a driving end of the pull-down transistor of the output stage.

The output stage of the invention is preferably a bipolar output stage comprising a bipolar transistor Q1, or bipolar transistors Q1 and Q2 having a Darlington connection. The MOS transistors TR1 to TR7 for driving the output stage may be n-channel or p-channel type.

In this embodiment, the MOS transistor TR5 for driving the bipolar transistor Q1 is preferably a p-channel type. The other MOS transistors may be selected according to the requirements and wiring, and FIG. 1 shows an example of such a selection.

Figure 1:
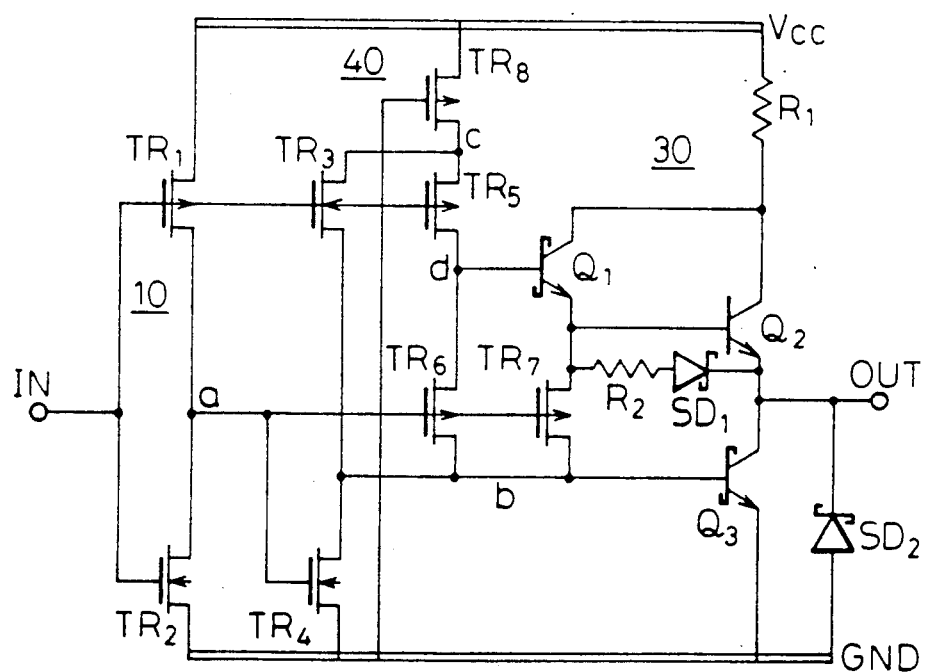
FIG. 1 is a circuit diagram showing a Bi-CMOS circuit according to an embodiment of the invention.
Figure 3:
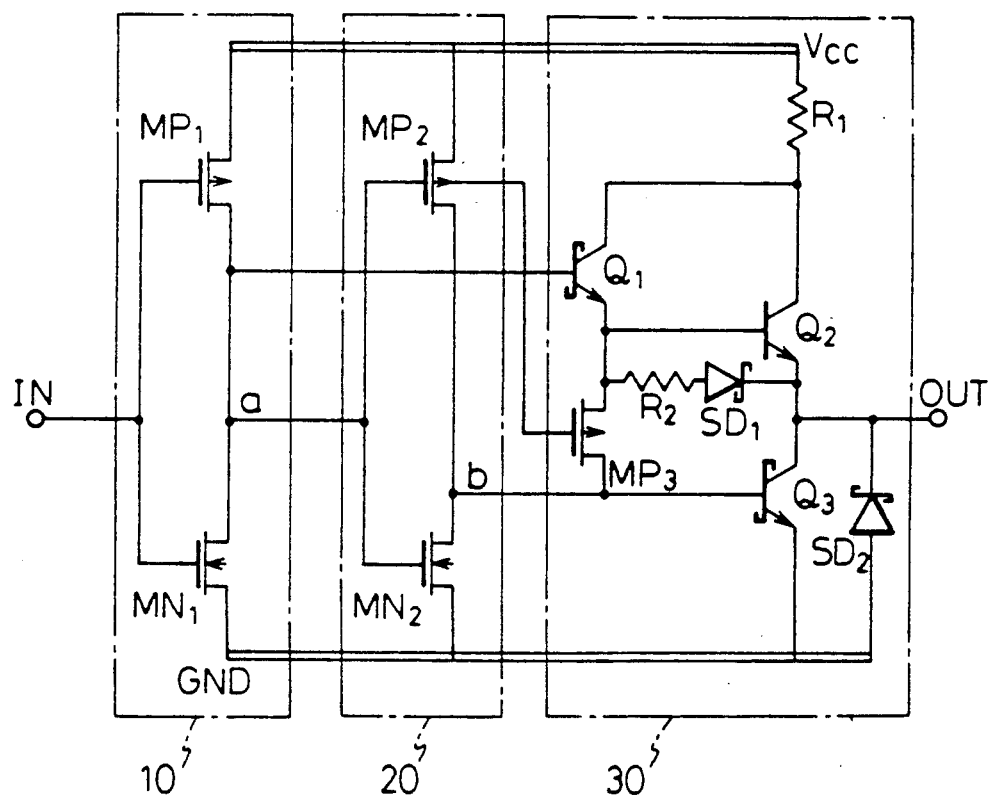
FIG. 3 is a circuit diagram showing a prior art Bi-CMOS circuit.

In FIG. 1, the second CMOS inverter 20 of the conventional circuit of FIG. 3 is replaced with the CMOS circuit 40 comprising the p-channel MOS transistors TR5 and TR6, and the n-channel MOS transistors TR3 and TR4.

The gate of the p-channel MOS transistor TR5 receives the input signal IN, and an output end "d" drives the pull-up transistors Q1 and Q2 of the output stage. The gate of the n-channel MOS transistor TR3 also receives the input signal IN, and an output end "b" drives the pull-down transistor Q3 of the output stage.

The gates of the n-channel MOS transistor TR4 and p-channel MOS transistor TR6 receive an output of the CMOS inverter 10, the transistor TR4 discharges the base of the pull-down transistor Q3, and the transistor TR6 discharges the base of the pull-up transistor Q1.

As apparent from the comparison of FIGS. 1 and 3, the first CMOS inverter 10 and bipolar output stage 30 of FIG. 3 are the same as those of FIG. 1, but the second inverter 20 of FIG. 3 differs from the CMOS stage 40 of FIG. 1.

The CMOS stage 40 of FIG. 1 comprises the p-channel MOS transistors TR8, TR5, and TR6 connected in series between the power source Vcc and the node "b", and the n-channel MOS transistors TR3 and TR4 connected in series between a node "c" and a ground GND. A gate of the p-channel MOS transistor TR8 is connected to the ground GND, and thus the transistor TR8 is always ON and acts as a resistor. The transistor TR8 brings the potential at the node "c" to a level slightly lower than that of the power source Vcc, thereby lowering an output level and realizing three states. The MOS transistor TR8 can be replaced, therefore, by a simple resistor.

The gates of the transistors TR3, TR5, and TR1 receive the input signal IN, and the gates of the transistors TR6, TR4, and TR7 are connected to the output node "a" of the CMOS inverter 10. The node "b" of the transistors TR3 and TR4 and the node "d" of the transistors TR5 and TR6 are output nodes of the CMOS circuit 40.

When the input IN is high (H), the transistors TR1 and TR5 are made OFF, the transistors TR2 and TR3 are made ON, the node "a" is made low (L), the transistor TR4 is made OFF, the transistors TR6 and TR7 are made ON, the node "b" is made H, the transistor Q3 is made ON, the node "d" is made L, and the transistors Q1 and Q2 are made OFF, and thus the output OUT is made L.

When the input IN is L, the transistor TR1 is made ON, the transistor TR3 is made OFF, the transistor TR5 is made ON, the transistor TR2 is made OFF, the node "a" is made H, the transistor TR4 is made ON, the transistors TR6 and TR7 are made OFF, the node "b" is made L, the transistor Q3 is made OFF, the node "d" is made H, and the transistors Q1 and Q2 are made ON, and thus the output OUT is made H.

When the input IN is L and the output OUT is H, the pull-up transistors Q1 and Q2 are driven by the transistor TR5, which receives the input signal IN. When the input IN is H and the output OUT is L, the pull-down transistor Q3 is driven by the transistor TR3, which receives the input signal IN. In each of the above cases, the transistor(s) of the output stage is driven through a single transistor, and this causes an equal delay of a rise and fall of an output signal.

In the circuit of FIG. 1, the transistor TR5 receives the input signal IN and pulls up the output OUT, and the transistor TR3 receives the input signal IN and pulls down the output OUT. When pulling up the output OUT, the CMOS inverter 10 discharges the base of the pull-down transistor Q3 by turning ON the transistor TR4, and when pulling down the output OUT, the CMOS inverter 10 discharge the bases of the pull-up transistors Q1 and Q2 by turning ON the transistors TR6 and TR7. Namely, the CMOS inverter 10 achieves a supplementary operation. The pull-up or pull-down operation is carried out through the single transistor TR5 or TR3 by the input signal IN. In this circuit, the input signal IN drives the four transistors TR1, TR2, TR3, and TR5 which will be a heavy load (gate capacity). Accordingly, a circuit for providing the input signal IN must have a capacity sufficient to drive a large load.

A Bi-CMOS circuit according to another embodiment of the invention will be explained with reference to FIG. 2.

Figure 2:
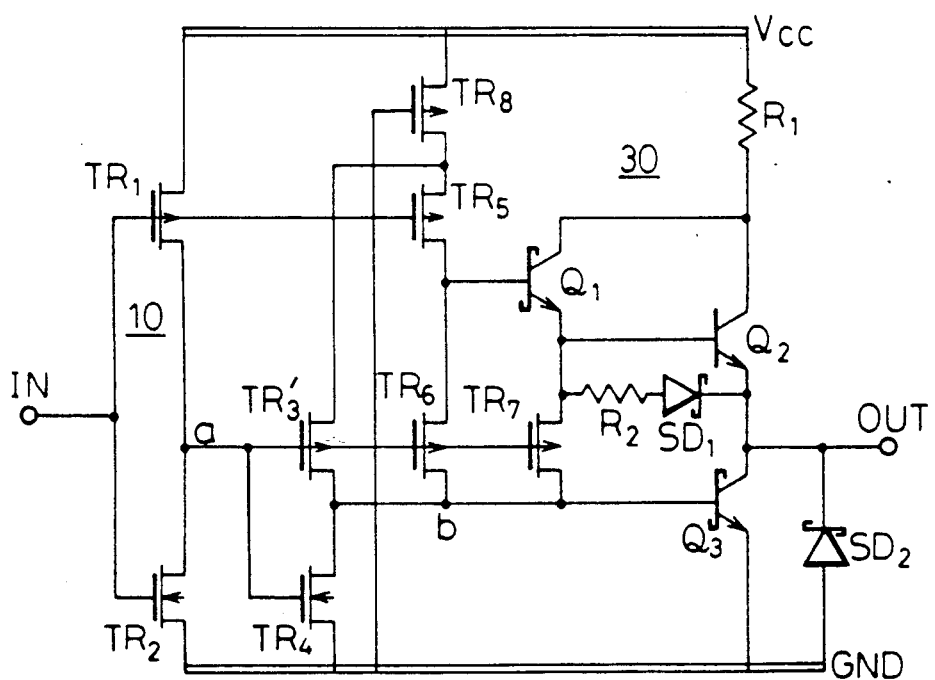
FIG. 2 is a circuit diagram showing another embodiment of the invention.

This embodiment is basically the same as FIG. 1, but the MOS transistor TR3 of FIG. 1 is an n-channel type, and a MOS transistor TR3' of FIG. 2 is a p-channel type. Also, a base of the transistor TR3' of FIG. 3 is connected to an output end of a MOS inverter 10.

In the second embodiment of FIG. 2, the number of transistors driven by an input signal IN is reduced by one, i.e., to three. Namely, the n-channel MOS transistor TR3 driven by the input signal of the first embodiment of FIG. 1 is replaced with the p-channel MOS transistor TR3' driven by an output of the CMOS inverter 10.

An operation of the second embodiment will be explained. When the input signal IN is high (H), transistors TR1 and TR5 are made OFF, the transistor TR2 is made ON, the node "a" is made low (L), the transistors TR3', TR6, and TR7 are made ON, the transistor TR4 is made OFF, the node "b" is made H, the transistor Q3 is made ON, and the transistors Q1 and Q2 are made OFF, and thus an output OUT is made L.

When the input signal IN is L, the transistors TR1 and TR5 are made ON, the transistor TR2 is made OFF, the node "a" is made H, the transistors TR3', TR6, and TR7 are made OFF, the transistor TR4 is made ON, the transistor Q3 is made OFF, and the transistors Q1 and Q2 are made ON, and thus the output OUT is made H.

In this circuit, the input signal IN is supplied to three MOS transistors. For pulling up the output OUT, however, only one transistor TR5 is interposed, but for pulling down the output OUT, the CMOS inverter 10 and transistor TR3' are interposed, and as a result, the pulling up operation and pulling down operation may occur at different delay times.

Instead of using the two transistors Q1 and Q2 having a Darlington connection on the pull-up side of the bipolar output stage, only one bipolar transistor may be employed, and in this case, the transistor TR7 is omitted.

As explained above, the invention interposes a single MOS transistor when changing the output OUT from high (H) to low (L) by an input signal IN, to thereby improve an operation speed of the output buffer. Results of a simulation shown that the invention can improve the operation speed by about 1 ns, compared with the 4 to 5 ns of the conventional circuit. When changing the output from L to H, the invention also interposes a single MOS transistor, and thus an equal delay occurs in the fall and rise of the output, and as a result, a duty ratio of the output buffer is substantially unchanged.

We claim:

1. A Bi-CMOS circuit supplied with an input signal, comprising:
   an output stage including pull-up and pull-down transistors connected in series between a high-potential power source and a low-potential power source, to receive the drive signals respectively, a node of the pull-up and pull-down transistors forming an output end; and
   a CMOS circuit coupled to said output stage, for receiving an input signal and generating drive signals for driving the output stage, the CMOS circuit including
   a CMOS inverter for receiving an input signal, and
   a MOS sub-circuit coupled to the CMOS inverter, having a first MOS transistor for driving the pull-up transistor of the output stage based on the input signal, a second MOS transistor for driving the pull-down transistor of the output stage based on the input signal, a third MOS transistor for discharging the pull-up transistor based on an output of the CMOS inverter, and a fourth MOS transistor for discharging the pull-down transistor based on the output of the CMOS inverter.

2. A Bi-CMOS circuit as set forth in claim 1, wherein:
   the first, third and fourth MOS transistors are connected in series between the high-potential power source and the low-potential power source,
   a gate of the first MOS transistor is directly connected to an input of the CMOS inverter,
   respective gates of the third and fourth MOS transistors are connected to the output of the CMOS inverter,
   the second MOS transistor is connected in parallel with the first and third MOS transistors,
   a gate of the second MOS transistor is connected to the input of the CMOS inverter,
   a node of the first and third MOS transistors is connected to a driving end of the pull-up transistor of the output stage, and
   a node of the third and fourth MOS transistors is connected to a driving end of the pull-down transistor of the output stage.

3. A Bi-CMOS circuit as set forth in claim 2, wherein the first MOS transistor is a p-channel type MOS transistor.

4. A Bi-CMOS circuit as set forth in claim 1, wherein the output stage is a bipolar output stage including bipolar transistors.

5. A Bi-CMOS circuit as set forth in claim 2, wherein the output stage includes two bipolar-type pull-up transistors having a Darlington connection.

6. A Bi-CMOS circuit as set forth in claim 5, wherein:
   a base of a first one of the two bipolar-type pull-up transistors having the Darlington connection is connected to a node of the first and third MOS transistors,
   a base of a second one of said two bipolar-type pull-up transistors is connected to an end of a fifth MOS transistor,
   the other end of the fifth MOS transistor is connected to the fourth MOS transistor, and
   a gate of the fifth MOS transistor is connected to the output of the CMOS inverter.

7. A Bi-CMOS circuit as set forth in claim 2, wherein the first MOS transistor is a p-channel MOS transistor, the second MOS transistor is an n-channel MOS transistor, the third MOS transistor is a p-channel transistor, and the fourth MOS transistor is an n-channel transistor.

8. A Bi-CMOS circuit as set forth in claim 1, wherein the first and second MOS transistors are connected to the high-potential power source through an impedance means.

9. A Bi-CMOS circuit as set forth in claim 8, wherein the impedance means comprises a resistor or a MOS transistor.

10. A Bi-CMOS circuit as set forth in claim 2, wherein a gate of the second MOS transistor is connected to an output of the CMOS inverter.

11. A Bi-CMOS circuit supplied with an input signal, comprising:
    a CMOS inverter for receiving the input signal, and for generating an inverted signal based on the input signal;
    a first MOS driving transistor for generating a first driving signal in response to the input signal;
    a second MOS driving transistor coupled to said CMOS inverter, for generating a second driving signal based on the inverted signal;
    a bipolar pull-up transistor circuit coupled to the first MOS driving transistor, for pulling up an output signal level based on the first driving signal; and
    a bipolar pull-down transistor circuit coupled to said bipolar pull-up transistor circuit and said second MOS driving transistor, for pulling down the output signal level at a coupling point between said bipolar pull-up transistor circuit and said bipolar pull-down transistor, based on the second driving signal;
    said bipolar pull-up transistor circuit including a Darlington pair.

* * * * *

UNITED STATES PATENT AND TRADEMARK OFFICE
CERTIFICATE OF CORRECTION

PATENT NO. : 5,177,377
DATED : January 5, 1993
INVENTOR(S) : Mathuda et al.

It is certified that error appears in the above-identified patent and that said Letters Patent is hereby corrected as shown below:

Column 1, line 26, after "turns" insert --ON--.

Column 2, line 29, change "tee" to --the--;

Column 2, line 30, change "ensure"

to --ensures--.

Column 4, line 8, after "H," insert --and--;

Column 4, line 9, change "ON," to

--ON.  Further,--;

Signed and Sealed this

Twenty-first Day of December, 1993

Attest:

BRUCE LEHMAN

Attesting Officer        Commissioner of Patents and Trademarks